(12) United States Patent
Fan et al.

(10) Patent No.: US 10,608,078 B2
(45) Date of Patent: Mar. 31, 2020

(54) BONDED SUBSTRATE FOR EPITAXIAL GROWTH AND METHOD OF FORMING THE SAME

(71) Applicant: GLOBALWAFERS CO., LTD., Hsinchu (TW)

(72) Inventors: Chun-I Fan, Hsinchu (TW); Chih-Yuan Chuang, Hsinchu (TW); Man-Hsuan Lin, Hsinchu (TW); Wen-Ching Hsu, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 0 days.

(21) Appl. No.: 15/933,978

(22) Filed: Mar. 23, 2018

(65) Prior Publication Data
US 2018/0315814 A1    Nov. 1, 2018

(30) Foreign Application Priority Data

Apr. 28, 2017 (TW) .............................. 106114177 A
Jan. 8, 2018 (TW) .............................. 107100680 A

(51) Int. Cl.
| | |
|---|---|
| *H01L 29/06* | (2006.01) |
| *H01L 21/18* | (2006.01) |
| *H01L 29/36* | (2006.01) |
| *H01L 21/324* | (2006.01) |
| *H01L 21/225* | (2006.01) |
| *H01L 29/10* | (2006.01) |
| *H01L 21/76* | (2006.01) |

(52) U.S. Cl.
CPC ........ *H01L 29/0638* (2013.01); *H01L 21/187* (2013.01); *H01L 21/2251* (2013.01); *H01L 21/324* (2013.01); *H01L 21/7605* (2013.01); *H01L 29/1075* (2013.01); *H01L 29/1083* (2013.01); *H01L 29/36* (2013.01)

(58) Field of Classification Search
CPC ...................... H01L 21/2254; H01L 21/02686
See application file for complete search history.

(56) References Cited

U.S. PATENT DOCUMENTS

2015/0041863 A1* 2/2015 Johnson .............. H01L 31/0687
257/201

* cited by examiner

*Primary Examiner* — Moazzam Hossain
*Assistant Examiner* — Hajar Kolahdouzan
(74) *Attorney, Agent, or Firm* — Tracy Heims; Apex Juris, pllc.

(57) ABSTRACT

A bonded substrate for epitaxial growth and a method for forming the same are disclosed. The method includes steps of providing a first substrate, which has a first dopant concentration; providing a second substrate, which has a second dopant concentration, wherein the second dopant concentration is lower than the first dopant concentration; directly bonding a first surface of the first substrate with a second surface of the second substrate to form a bonded substrate; annealing the bonded substrate to form a high impedance layer in the bonded substrate; and removing part of the second substrate to expose the high impedance layer depending on the requirements whereby, the bonded substrate formed by the method could have a heavily doped substrate which includes a stronger strength and the impedance layer formed thereon, which could effectively increase the substrate strength, reduce the leakage current, and sustains a higher breakdown voltage.

10 Claims, 2 Drawing Sheets

BONDED SUBSTRATE FOR EPITAXIAL GROWTH AND METHOD OF FORMING THE SAME

BACKGROUND OF THE INVENTION

1. Technical Field

The present invention is related to a technology of semiconductor manufacturing which involves a bonded substrate for epitaxial growth and a method for forming the same, and more particularly related to forming a high impedance layer in a substrate which could sustain a higher breakdown voltage and thereby to provide a high-power and high-frequency semiconductor device.

2. Description of Related Art

For conventional semiconductor manufacturing process, an epitaxial layer is grown on a surface of a single crystal substrate or a poly crystal substrate, and then a semiconductor device or a circuit is formed on the epitaxial layer.

To meet the requirement for the high-power and high-frequency semiconductor applications, it is necessary for the semiconductor devices to be able to sustain a higher breakdown voltage and to reduce the leakage current form the substrate as much as possible. For instance, the introduction of SOI wafer (Silicon on insulator wafer) is to reduce the leakage current from the substrate. In conventional SOI substrates, an oxide layer (e.g. SiO2) is usually added into two silicon substrates to be used as an insulator and a bonding layer. However, it is known that the oxide layer is a bad heat conductor. Therefore, it is frequently seen that the SOI substrate made by the conventional SOI process usually includes a drawback of low heat dissipation efficiency.

In addition, to increase the strength of the substrate, a heavily doped substrate could be utilized in the epitaxial growth process. However, even though the heavily doped substrate is stronger, it is easily to generate leakage current due to a low resistivity of the heavily doped substrate. Furthermore, the lattice coefficients of the substrate and the epitaxial layer are not matched with each other in the epitaxial process, which causes that the substrate tends to bow or break after the epitaxial process easily.

Hence, there is still a need to provide a substrate which includes a stronger strength, a low leakage current, and satisfactory heat dissipation efficiency, and could sustain a high breakdown voltage as well.

BRIEF SUMMARY OF THE INVENTION

In view of the above, an object of the present invention is to provide a method for forming a bonded substrate for epitaxial growth, and thereby to provide a bonded substrate which could have a smaller leakage current, a higher breakdown voltage, a better heat dissipation performance and a stronger strength.

The present invention provides a method for forming a bonded substrate for epitaxial growth which including steps of providing a first substrate, which has a first dopant concentration; providing a second substrate, which has a second dopant concentration, wherein the second dopant concentration is lower than the first dopant concentration; directly bonding a first surface of the first substrate with a second surface of the second substrate to form a bonded substrate; and annealing the bonded substrate to form a high impedance layer in the bonded substrate.

The present invention also provides a bonded substrate for epitaxial growth which includes a first substrate having a first dopant concentration; a second substrate which is bonded to the first substrate and has a second dopant concentration, wherein the second dopant concentration is lower than the first dopant concentration; and a high impedance layer formed in the bonded substrate for epitaxial growth.

An advantage of the present invention is that the bonded substrate is constituted by the first substrate and the second substrate, wherein a bad heat conductor layer such as an oxide is not formed in the junction of the first substrate and the second substrate, whereby the bonded substrate provided by the present invention could have a high heat dissipation efficiency. In addition, the bonded substrate of the present invention not only could avoid substrate bow and substrate breaking to increase the substrate strength, but also could effectively reduce the leakage current and increase the breakdown voltage.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

The following illustrative embodiments and drawings are provided to illustrate the disclosure of the present invention, these and other advantages and effects can be clearly understood by persons skilled in the art after reading the disclosure of this specification.

Figure 1:
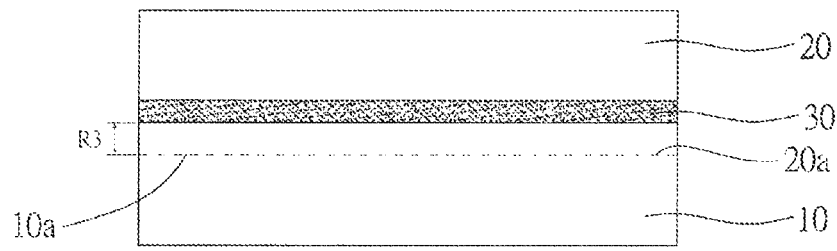
FIG. 1 is a schematic view of an embodiment according to the present invention.

The present invention will now be described in detail with reference to an embodiment thereof as illustrated in the accompanying drawings. Referring to FIG. 1, a bonded substrate for epitaxial growth which is manufactured by a forming method of an embodiment according to the present invention is illustrated, wherein the method includes the following steps.

First, a first substrate 10 having a first surface 10a and a first dopant concentration is provided. In the current embodiment, the first substrate 10 is a heavily dopant substrate which includes a thickness of about 1000 μm, wherein the first dopant concentration is equal to or greater than $1 \times 10^{18}$ atom/cm$^3$, preferably between $1 \times 10^{18}$ and $1 \times 10^{19}$ atom/cm$^3$, and a resistivity of the first substrate 10 is between 0.0025 ohm-cm to 0.0045 ohm-cm. Wherein, the first substrate 10 could be doped with a donor dopant or an acceptor dopant, such as Boron (B), Aluminum (Al), Gallium (Ga), Phosphorus (P), Arsenic (As), Antimony (Sb) or a combination thereof, although this is not a limitation of the present invention.

Then, a second substrate 20 having a second dopant concentration is provided, wherein the second dopant concentration is lower than the first dopant concentration. Preferably, a difference between the second dopant concentration and the first dopant concentration is at least greater than $1\times10^2$ atom/cm$^3$. For instance, in one embodiment, the second dopant concentration of the second substrate 20 is equal to or lower than $1\times10^{15}$ atom/cm$^3$, and a resistivity of the second substrate 20 is between 40 and 45 ohm-cm, while the first dopant concentration of the first substrate 10 is equal to or lower than $1\times10^{18}$ atom/cm$^3$, wherein the difference between the second dopant concentration and the first concentration is at least $1\times10^3$ atom/cm$^3$. Moreover, the second substrate 20 and the first substrate 10 are doped with conductivities which are opposite to each other. For instance, the first substrate 10 is selected from a p-type single crystal silicon substrate, while the second substrate 20 is selected from an n-type single crystal silicon substrate. As illustrated in FIG. 1, the second substrate 20 includes a second surface 20a. The second surface 20a of the second substrate 20 is bonded to the first surface 10a of the first substrate 10 to form a bonded substrate including the second substrate 20 and the first substrate 10. In the current embodiment, a bonding method includes contacting the second surface 20a of the second substrate 20 with the first surface 10a of the first substrate 10 and pressing the second substrate 20 and the first substrate 10 together to directly bond the first substrate 10 and the second substrate 20 to form a bonded substrate. It is worth mentioning that since the bonded substrate is formed by bonding the first substrate 10 and the second substrate 20 directly, there is no bad conductor such as oxide between the interface of the first substrate 10 and the second substrate 20, thereby having a high heat-dissipation characteristic.

In addition, in one embodiment, steps of rinsing and/or polishing the surfaces of the first substrate 10 and the second substrate 20 could be performed before bonding the two substrates. For instance, the first substrate 10a of the first substrate 10 and the second surface 20a of the second substrate 20 could be rinsed to remove impurities such as organic substances, photoresists, etc., and polished to reduce surface roughness and increase flatness, whereby improving a yield rate of the following bonding process. Wherein, the rinsing method includes a RCA cleaning process, and the polishing method includes a CMP process, although this is not a limitation for other practical applications.

Subsequently, the bonded substrate is treated with an annealing process to enhance the bonding between the first substrate 10 and the second substrate 20 and form a high impedance layer 30 in the bonded substrate. For instance, in the current embodiment, the impedance layer 30 is formed by dopant diffusion and ion compensation of the p-type and n-type dopants in the bonded substrate during the annealing process. Wherein, a formation site of the high impedance layer 30 and a resistivity thereof could be controlled by tuning the dopant concentration and the annealing time. In more details, in the current embodiment, the dopant in the first substrate 10 would diffuse into the second substrate 20 in the annealing process, which creates a high resistant region (e.g. the high impedance layer 30) which has a concentration is higher than an initial concentration of the second substrate 20. According to the present invention, the annealing process is utilized to form the high impedance layer 30 having a dopant concentration between $1\times10^{15}$ and $1\times10^{19}$ atom/cm$^3$ within a predetermined range, such as in the range of the second substrate 20.

In the annealing process of the current embodiment, the temperature is between 1000 and 1300° C., and the process time is between 4 and 50 hours. Furthermore, the annealing temperature and the annealing time could be varied depending on different applications of the substrate. For example, a different annealing temperature and a different annealing time could be set to meet the requirement of a different resistivity of the high impedance layer. For instance, the temperature could be between 1100 and 1275° C., and the annealing time could be selected from 30 hours, 40 hours, or 50 hours, although this is not a limitation of the present application.

Whereby, the resistivity of the obtained high impedance layer 30 is equal to or greater than 300 ohm-cm, or equal to or greater than 1000 ohm-cm. In addition, based on the dopant concentration, the annealing temperature, and a suitable thickness of the first substrate 10, the bonded substrate for epitaxial growth could have the high impedance layer 30 even after the high-temperature epitaxial process, i.e., the formed high impedance layer 30 would not be disappeared due to high-temperature diffusion in the epitaxial process.

The bonded substrate for epitaxial growth of the present invention is a bonded substrate formed by directly bonding of the first substrate 10 and the second substrate 20, wherein there is no oxide between the two substrates. Hence, as comparing to the substrates formed by the conventional SOI process, the bonded substrate for epitaxial growth according to the present invention utilizes the high impedance layer which is formed of the same material with the substrate as the insulation layer and is free from a step of introducing an oxide layer, whereby the bonded substrate of the present invention has a better heat dissipation performance than the substrate formed by the conventional SOI process. In the current embodiment, the thickness of the high impedance layer 30 is between 1 and 10 μm, and preferably between 2 and 3 μm, although it is not a limitation of the present invention, in other embodiments, the thickness of the high impedance layer 30 could be adjusted according to the resistivity and the dopant concentration of the first substrate 10 and the second substrate 20, or different process conditions.

Thereafter, an epitaxial process or a device manufacturing process could be applied on the second substrate 20 and the high impedance layer 30, for example a process for forming a material layer such as a nucleation layer, an epitaxial layer, an active layer, an electrode layer, etc., or a process for forming a seed layer, a buffer layer, a channel layer, a barrier layer, a source region, a gate region or a drain region, which could be utilized to form devices such as power semiconductor devices or RF semiconductor devices.

It shall be noted that since the first substrate 10 is a heavily doped substrate according to the present invention, it is favorable to prevent the first substrate 10 which is used as a supporting substrate from being bowed due to the difference of lattice coefficient and the thermal expansion coefficient between the substrate and the epitaxial layer in the following epitaxial process which might result in cracking of the epitaxial layer. For instance, the following Table 1 illustrates the experimental data of three group of substrates having different wafer resistivity being performed with a MOCVD process. After comparing the experimental results, it could be understood that based on the same wafer thickness and the same epitaxial layer thickness, the substrate has a smaller bow which could be controlled to be smaller than 10 μm when the wafer resistivity is lower (i.e., a higher dopant concentration), while the substrate has a greater bow when the wafer resistivity is higher (i.e., a lower dopant concentration). By controlling the dopant concentration of the first and the second substrates and the annealing time, the present invention could provide a bonded substrate for epitaxial growth which has characteristics of low bow and high resistivity as well.

TABLE 1

| Group | Wafer resistivity | Wafer thickness (μm) | Thickness of epitaxial layer: PL (μm) | BOW (μm) |
|---|---|---|---|---|
| 1 | 2.5 mΩ-cm | 1000 | 4.5 | 4.1 |
| 2 | 1 Ω-cm | 1000 | 4.5 | 10.3 |
| 3 | 10 Ω-cm | 1000 | 4.5 | 29.3 |

During the following MOCVD process for epitaxial growth or device manufacturing process, the high impedance layer formed in the bonded substrate could effectively prevent the electric current which is produced in the forming steps of the semiconductor devices or circuits from flowing through the high impedance layer 30 to reduce leakage current. That is, the leakage current problems of the semiconductor devices or the circuits could be effectively improved. In view of the above, the bonded substrate of the present invention could sustain a higher voltage and a breakdown voltage, which is favorable to be utilized in field of the high-frequency and high-power semiconductor devices.

In addition, it is usually required to remove the second substrate on the impedance layer to expose of the high impedance layer for subsequent epitaxial growth process. According to the present invention, a ratio of the removed substrate to the first substrate is properly controlled to minimize a reduction in the total thickness of the bonded substrate and to retain the high impedance layer in the subsequent high-temperature epitaxial process.

Figure 2:
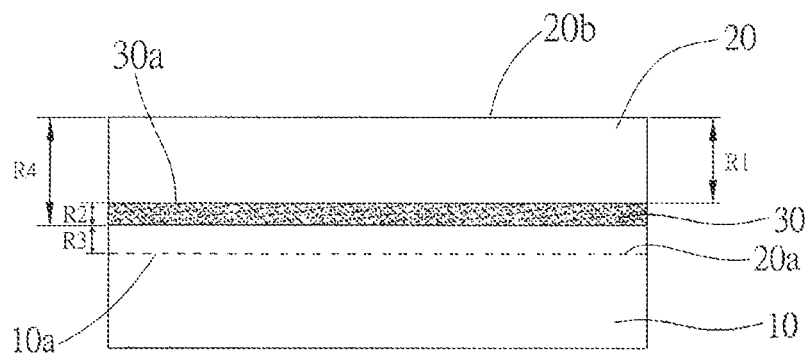
FIG. 2 is a schematic view of the embodiment of FIG. 1 which illustrates a removed amount of the second substrate and a thickness of the high impedance layer.

For instance, at least part of the second substrate 20 could be removed after the annealing process, i.e., the thickness of the second substrate 20 is reduced, to expose a third surface 30a of the high impedance layer 30 (as shown in FIG. 2), whereby exposing the high impedance layer as possible for the subsequent process.

For instance, as illustrated in FIG. 2, the removed amount of the second substrate 20 is denoted as R1, and the thickness of the high impedance layer 30 is denoted as R2, wherein the removed amount R1 refers to a removed thickness of the second substrate 20, which is calculated from a top surface 20a of the second substrate 20 to the third surface 30a of the high impedance layer 30. In the current embodiment, the removed amount R1 of the second substrate 20 is preferably equal to or greater than 60% of the volume of the first substrate 10. That is, the removed thickness of the second substrate 20 is equal to or greater than 60% of the thickness of the first substrate 10, and in other words, a remained thickness of the second substrate 20 after the removing process is equal to or smaller than 40% of the thickness of the first substrate 10, whereby to effectively reduce the total thickness of the bonded substrate and retain the advantage of sustaining a high breakdown voltage.

Wherein, a grinding or a polishing process could be utilized to remove the thickness of the second substrate 20, although this is not a limitation for other practical applications. In other embodiments, a chemical etching process, a photolithography etching process, a laser process or other physical methods also could be utilized.

Figure 4:
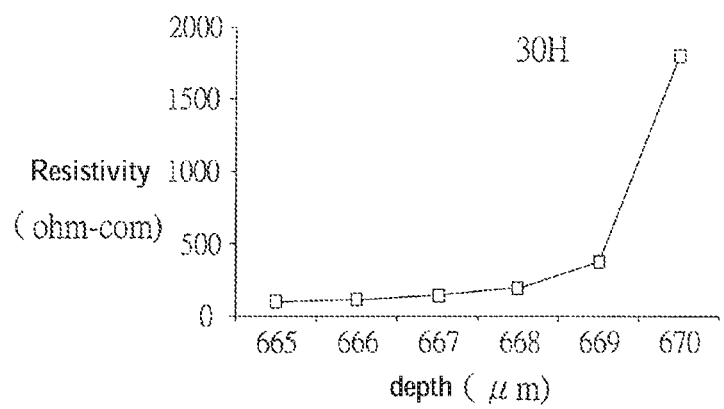
FIG. 4 to FIG. 6 are schematic charts for the characteristic of the substrates according to the embodiments of the present invention, wherein the substrates are processed with different annealing times respectively (30 hours, 40 hours, and 50 hours), wherein each of which illustrates a relation of the diffusion depth and the corresponding resistivity.
Figure 5:
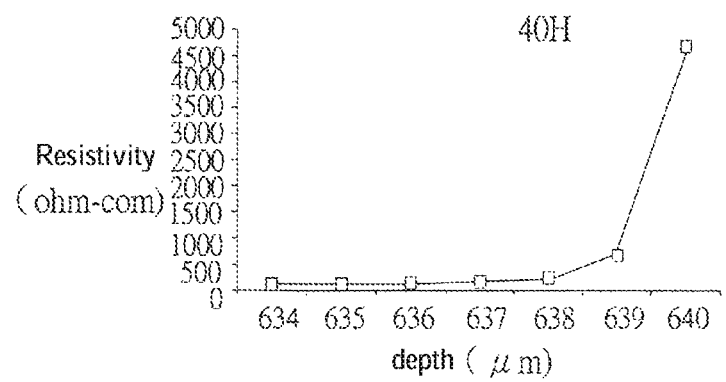
Figure 6:
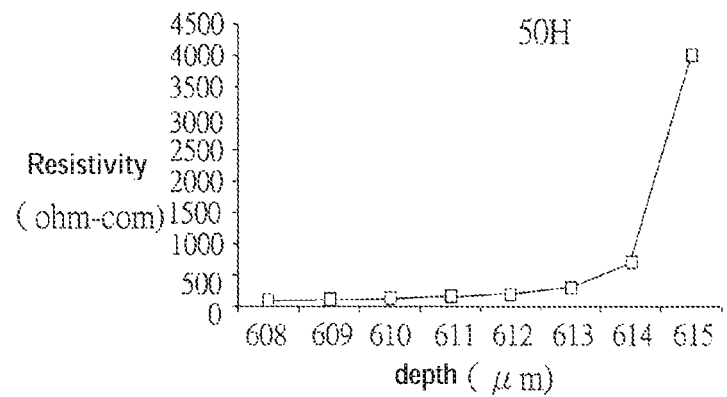

Meanwhile, even though the resistivity and the dopant concentration of the substrate has been set in the current embodiment, different annealing time of the bonded substrate also would change the formation site of the high impedance layer. For instance, the heavily doped ions would diffuse to a deeper thickness when the annealing time increases; the high impedance layer would become closer to the top surface of the second substrate when the annealing time is longer. The relation between the removed amount of the second substrate and the annealing time would be described with the following three experiments which have different annealing times, wherein the bonded substrates of the three experiments have the set resistivity and the dopant concentration used in the embodiments. Referring to FIG. 4 to FIG. 6, which are charts respectively showing a relation between the diffusion depth and the corresponding resistivity based on an annealing time of 30 hours, 40 hours and 50 hours.

Also referring to the following Table 2, the data of the depth R4 of the high impedance layer 30, the diffusion depth R3 of the high impedance layer 30, and the removed amount R1 of the second substrate 20 after the annealing time of 30 hours, 40 hours, and 50 hours are shown in the table. Wherein, the depth R4 of the high impedance layer 30 refers to a depth between the top surface 20b to the second surface 20a of the second substrate 20; the diffusion depth R3 of the high impedance layer 30 refers to a diffusion depth of the heavily doped ions from the second surface 20a between the second substrate 20 and the first substrate 10 toward the top surface 20b of the second substrate 20, which increases with the annealing time; the removed amount R1 of the second substrate 20 refers to a value obtained from subtracting the thickness R2 of the high impedance layer 30 from the depth R4 of the high impedance layer 30 (e.g. the thickness of the high impedance layer 30 is between 1 and 10 μm in the current embodiment). From Table 2, it could be understood that the removed amount of the second substrate 20 is inversely proportion to the diffusion depth and the diffusion time of the heavily dopant ions. That is, when the diffusion time is longer, and the diffusion depth is deeper, the removed amount of the second substrate would be smaller and the thickness of the bonded substrate would be greater.

TABLE 2

| Depth of the high impedance layer (μm) | Diffusion depth (μm) | Removed amount of the second substrate (μm) |
|---|---|---|
| Annealing time 30 hours | | |
| 669 | 46.99 | 659-664 |
| 670 | 45.99 | 660-665 |
| Annealing time 40 hours | | |
| 639 | 76.99 | 629-634 |
| 640 | 75.99 | 630-635 |
| Annealing time 50 hours | | |
| 614 | 101.99 | 604-609 |
| 615 | 100.99 | 605-610 |

The following Table 3 indicates the ratios of the removed amount of the second substrate 20 to the thickness of the first substrate 10 with respect to different annealing times (e.g. 30 hours, 40 hours, 50 hours).

TABLE 3

| Depth of the high impedance layer (μm) | Minimum value | Maximum value |
|---|---|---|
| Annealing time 30 hours | | |
| 669 | 65.9% | 66.4% |
| 670 | 66.0% | 66.5% |
| Annealing time 40 hours | | |
| 639 | 62.9% | 63.4% |
| 640 | 63.0% | 63.5% |
| Annealing time 50 hours | | |
| 614 | 60.4% | 60.9% |
| 615 | 60.5% | 61.0% |

Referring to FIG. 4, the experiment parameters and related data of the bonded substrate for epitaxial growth according to the method of the above embodiments, wherein the thickness of the high impedance layer is denoted as R2 (as shown in FIG. 2), and the diffusion depth of the high impedance layer is denoted as R3 (as shown in FIG. 1).

The first substrates used in the first to the fourth experiment are the same, wherein the first substrates are all of p-type single crystal silicon substrate which is doped with Boron and has a dopant concentration of $1 \times 10^{19}$ atom/cm$^3$, a resistivity of 0.00355 Ω-cm, and a thickness of 1000 μm. The second substrates used in the first to the fourth experiment are the same, wherein the first substrates are all of n-type single crystal silicon substrate which is doped with Phosphorus and has a dopant concentration of $1 \times 10^{14}$ atom/cm$^3$, a resistivity of 45 Ω-cm, and a thickness of 650 μm.

After forming the bonded substrates by directly bonding the first substrate and the second substrate in the first to the fourth experiments respectively, an annealing treatment is applied to the bonded substrates, wherein the annealing temperatures of the first to the fourth experiments are all of 1150° C., while the annealing times for the first to the fourth experiments are 0 hours, 6 hours, 10 hours, and 20 hours, respectively. Thereafter, an epitaxial process is applied to the bonded substrate at 1000° C. for 6 hours to form a GaN epitaxial layer on the bonded substrate.

After the GaN epitaxial process, a measurement is applied to the bonded substrates of the first to the fourth embodiments to obtain the following results.

(1) the diffusion depth of the high impedance layer of the first experiment is about 3.35 μm, a thickness thereof is about 2.01 μm, and a resistivity thereof is greater than 300 Ω-cm; (2) the diffusion depth of the high impedance layer of the second experiment is about 7.51 μm, a thickness thereof is about 2.74 μm, and a resistivity thereof is greater than 300 Ω-cm; (3) the diffusion depth of the high impedance layer of the third experiment is about 9.3 μm, a thickness thereof is about 2.82 μm, and a resistivity thereof is greater than 300 Ω-cm; (4) the diffusion depth of the high impedance layer of the fourth experiment is about 12.75 μm, a thickness thereof is about 2.97 μm, and a resistivity thereof is greater than 300 Ω-cm.

It could be understood from the above experiment results that the diffusion depth and the thickness of the high impedance layer would be different depending on different annealing times. In more details, when the annealing time is increased, the diffusion depth and the thickness of the high impedance layer would also be increased. Whereby, different annealing time could be selected to meet the application requirements corresponding to the bonded substrates. In practice, the annealing temperature or the dopant concentration and the resistivity of the first and the second substrates also could be utilized to control the diffusion depth, the thickness and the resistivity of the high impedance layer in addition to the adjustment on the length of the annealing time, although this is not a limitation of the present invention.

TABLE 4

| | | Experiment 1 | Experiment 2 |
|---|---|---|---|
| First substrate | Dopant concentration | >1E19 (atom/cm$^3$) | >1E19 (atom/cm$^3$) |
| | Resistivity | 0.0035 (Ω-cm) | 0.0035 (Ω-cm) |
| | Thickness | 1000 (μm) | 1000 (μm) |
| | Dopant | P-type: B (Boron) | P-type: B (Boron) |
| Second substrate | Dopant concentration | <1E14 (atom/cm$^3$) | <1E14 (atom/cm$^3$) |
| | Resistivity | 45 (Ω-cm) | 45 (Ω-cm) |
| | Thickness | 650 (μm) | 650 (μm) |
| | Dopant | N-type: P (Phosphorus) | N-type: P (Phosphorus) |
| Annealing temperature | | 1150° C. | 1150° C. |
| Annealing time | | 0 HR | 6 HR |
| GaN | Process | 1000° C./6 HR | 1000° C./6 HR |
| | Diffusion depth | 3.35 (μm) | 7.51 (μm) |
| High impedance layer (After GaN_epi) | Thickness | 2.01 (μm) | 2.74 (μm) |
| | Resistivity | >300 (Ω-cm) | >300 (Ω-cm) |

| | | Experiment 3 | Experiment 4 |
|---|---|---|---|
| First substrate | Dopant concentration | >1E19 (atom/cm$^3$) | >1E19 (atom/cm$^3$) |
| | Resistivity | 0.0035 (Ω-cm) | 0.0035 (Ω-cm) |
| | Thickness | 1000 (μm) | 1000 (μm) |
| | Dopant | P-type: B (Boron) | P-type: B (Boron) |
| Second substrate | Dopant concentration | <1E14 (atom/cm$^3$) | <1E14 (atom/cm$^3$) |
| | Resistivity | 45 (Ω-cm) | 45 (Ω-cm) |
| | Thickness | 650 (μm) | 650 (μm) |
| | Dopant | N-type: P (Phosphorus) | N-type: P (Phosphorus) |
| Annealing temperature | | 1150° C. | 1150° C. |
| Annealing time | | 10 HR | 20 HR |
| GaN | Process | 1000° C./6 HR | 1000° C./6 HR |
| High impedance layer (After GaN_epi) | Diffusion depth | 9.3 (μm) | 12.75 (μm) |
| | Thickness | 2.82 (μm) | 2.97 (μm) |
| | Resistivity | >300 (Ω-cm) | >300 (Ω-cm) |

Figure 3:
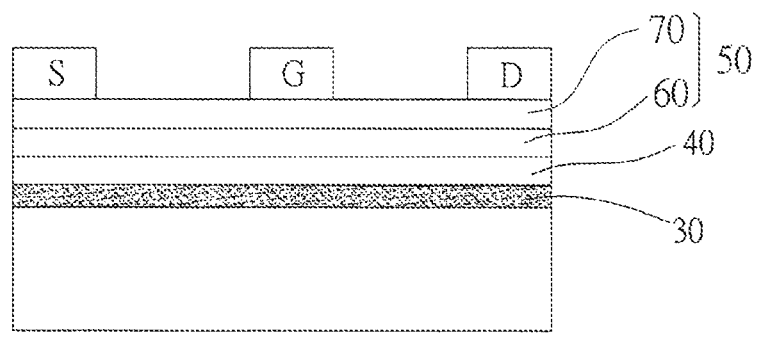
FIG. 3 is a schematic view showing an epitaxial structure is formed on the substrate of the present invention.

FIG. 3 illustrates an application example of forming an epitaxial structure on the bonded substrate of the current embodiment. For instance, a buffer layer 40 could be formed on the high impedance layer 30 or a preformed layer 22; wherein, in one embodiment, one or more seed layers (not shown) could be formed between the buffer layer 40 and the high impedance layer 30; next, an active layer 50 could be grown on the buffer layer 40, wherein the active layer could include a channel layer 60 and a barrier layer 70, and then a source electrode S, a gate electrode G, and a drain electrode D could be formed on the active layer, although this is not a limitation of the present invention.

By controlling the p-type and n-type dopant concentrations, and the resistivities of the first substrate and the second substrate, the high impedance layer formed in the junction of the first substrate and the second substrate would not be destroyed or diminished in the subsequent process (e.g. epitaxial process) and could be remained in the bonded substrate. Whereby, the bonded substrate could sustain a higher voltage and a higher breakdown value in the following device manufacturing process, which could be applied to the field of high-frequency and high-power semiconductors.

The above description is one of the embodiments of the present invention only, wherein persons skilled in the art should know that the thickness of the first and the second substrates could be adjusted depending on the requirements of the process or the devices for other practical applications to achieve the same performance of the present invention. The first substrate is not limited to be doped with acceptor dopants, and could be doped with donor dopants. For instance, in one embodiment, the dopant of the first substrate could be selected from Phosphorus (P), Arsenic (As), Antimony (Sb), or a combination thereof, and the second substrate is not limited to the single crystal silicon substrate which is doped with the donor dopants, and could be silicon substrates doped with acceptor dopants selected from Boron (B), Aluminum (Al), Gallium (Ga), or a combination thereof.

In addition, the first substrate and the second substrate are not limited to silicon substrates, and could be made of other type of substrates as long as the substrates are of the same material and have conductivities which are opposite to each other. For instance, the first substrate and the second substrate could be silicon carbide substrates, GaN substrate, etc., and are not limited to the single crystal silicon substrate.

Also, in some embodiments, the material of the first substrate and the second substrates could include, but is not limited to, single crystal, polycrystal and/or amorphous material, etc.; in some embodiments, the material of the first substrate and the second substrates could include, but is not limited to, SiC, GaN, GaP, InP, InAs, and/or InSb, etc.; in some embodiments, the material of the first substrate and the second substrates could include, but is not limited to, SiGe, GaAsP, AlInAs, AlGaAs, GaInAs, GaInP and/or GaInAsP, etc.; in some embodiments, the material of the first substrate and the second substrates could include, but is not limited to sapphire, GaO, LiGaO, LiAlO, Spinel, Ge, Glass, $ZrB_2$, $ScALMgO_4$, $SrCu_2O_2$, $LiGaO_2$, $LiAlO_2$, YSZ (Yttria-Stabilized Zirconia), or other suitable material.

In the aforementioned embodiments, the first substrate and the second substrate are directly bonded at a high temperature, although this is not a limitation of the present invention. In other practical applications, the first substrate and the second substrate also could be directly bonded at a low temperature.

Furthermore, the bonded substrate for epitaxial growth and the method for forming the same according to the present invention are not limited to the thickness ranges of the first substrate and the second substrate which are disclosed in the above embodiments. In other applications, different substrate thickness also could be adopted to meet different application requirements. It must be pointed out that the embodiments described above are only some embodiments of the present invention. All equivalent structures which employ the concepts disclosed in this specification and the appended claims should fall within the scope of the present invention.

What is claimed is:

1. A method for forming a bonded substrate for epitaxial growth, comprising:
   A. providing a first substrate, which has a first dopant concentration;
   B. providing a second substrate, which has a second dopant concentration, wherein the second dopant concentration is lower than the first dopant concentration;
   C. directly bonding a first surface of the first substrate with a second surface of the second substrate to form a bonded substrate;
   D. annealing the bonded substrate to form a high impedance layer in the bonded substrate; and
   E. removing at least part of the second substrate to expose a third surface of the second substrate after step D;
   wherein the third surface and the second surface respectively face toward opposite directions, a removed amount of the second substrate is at least equal to or greater than 60% of a thickness of the first substrate.

2. The method of claim 1, wherein the first dopant concentration is equal to or greater than $1\times10^{18}$ atom/$cm^3$, and the second dopant concentration is equal to or smaller than $1\times10^{15}$ atom/$cm^3$.

3. The method of claim 1, wherein the conductivities of the first substrate and the second substrate are opposite to each other.

4. A bonded substrate for epitaxial growth, comprising:
   a first substrate having a first dopant concentration;
   a second substrate which is bonded to the first substrate and has a second dopant concentration, wherein the second dopant concentration is lower than the first dopant concentration; and
   a high impedance layer formed in the bonded substrate for epitaxial growth;
   wherein a thickness of the second substrate is equal to or smaller than 40% of a thickness of the first substrate, the thickness of the second substrate is adjusted by removing at least part of the second substrate after the high impedance layer is formed.

5. The bonded substrate for epitaxial growth of claim 4, wherein a resistivity of the high impedance layer is equal to or greater than 300 ohm-cm.

6. The bonded substrate for epitaxial growth of claim 4, wherein the conductivities of the first substrate and the second substrate are opposite to each other.

7. The bonded substrate for epitaxial growth of claim 4, wherein a thickness of the high impedance layer is between 1 and 10 μm.

8. The bonded substrate for epitaxial growth of claim 7, wherein the thickness of the high impedance layer is between 2 and 3μm.

9. The bonded substrate for epitaxial growth of claim 4, wherein the first dopant concentration is equal to or greater than $1\times10^{18}$ atom/$cm^3$, and the second dopant concentration is equal to or smaller than $1\times10^{15}$ atom/$cm^3$.

10. The bonded substrate for epitaxial growth of claim 4, wherein a difference of the first dopant concentration and the second dopant concentration is at least greater than $1\times10^2$ atom/$cm^3$.

* * * * *